United States Patent
Song et al.

(10) Patent No.: US 12,166,949 B2
(45) Date of Patent: Dec. 10, 2024

(54) IMAGE SENSING DEVICE USING A SINGLE ANALOG TO DIGITAL CONVERSION OPERATION ON PIXEL SIGNALS AND OPERATING METHOD THEREOF

(71) Applicant: SK hynix Inc., Gyeonggi-do (KR)

(72) Inventors: Jeong Eun Song, Gyeonggi-do (KR); Oh Jun Kwon, Gyeonggi-do (KR); Yu Jin Park, Gyeonggi-do (KR); Sung Uk Seo, Gyeonggi-do (KR); Min Seok Shin, Gyeonggi-do (KR); Sun Young Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 290 days.

(21) Appl. No.: 17/535,927

(22) Filed: Nov. 26, 2021

(65) Prior Publication Data
US 2022/0329746 A1    Oct. 13, 2022

(30) Foreign Application Priority Data
Apr. 13, 2021    (KR) .......... 10-2021-0047962

(51) Int. Cl.
*H04N 13/204* (2018.01)
*G01B 11/22* (2006.01)
(Continued)

(52) U.S. Cl.
CPC .......... *H04N 13/204* (2018.05); *G01B 11/22* (2013.01); *G01R 19/10* (2013.01); *G01S 17/894* (2020.01);
(Continued)

(58) Field of Classification Search
CPC .. H04N 13/204; H04N 13/207; H04N 13/218; H04N 25/581
See application file for complete search history.

(56) References Cited

U.S. PATENT DOCUMENTS 8,810,676 B2    8/2014    Lim et al.
9,204,143 B2    12/2015   Wang et al.
(Continued)

FOREIGN PATENT DOCUMENTS

CN    207099208 U    3/2018
CN    208014701 U    10/2018
(Continued)

OTHER PUBLICATIONS

WO-2022002174-A1 machine translation (Year: 2022).*
Office Action for Chinese Patent Application No. 202210263157.8 issued by the Chinese Patent Office on Aug. 12, 2024.

*Primary Examiner* — David N Werner
(74) *Attorney, Agent, or Firm* — IP & T GROUP LLP

(57) ABSTRACT

An image sensing device includes a first sampling circuit suitable for sampling a reference ramp signal as a ramp signal; a switching circuit suitable for sequentially outputting first and second pixel signals to a common node based on first and second control signals; a second sampling circuit suitable for sampling the first and second pixel signals, which are sequentially outputted through the common node, as a measurement signal; a comparison circuit suitable for comparing the ramp signal with the measurement signal and generating a comparison signal corresponding to a comparison result; and a count circuit suitable for generating a count signal, which corresponds to a voltage level of the measurement signal, based on the comparison signal and a clock signal.

12 Claims, 12 Drawing Sheets

(51) Int. Cl.
  G01R 19/10 (2006.01)
  G01S 17/894 (2020.01)
  H04N 13/207 (2018.01)
  H04N 13/218 (2018.01)
  H04N 25/581 (2023.01)
  H04N 25/705 (2023.01)
  H04N 25/71 (2023.01)
  H04N 25/75 (2023.01)
  H04N 25/40 (2023.01)
  H04N 25/616 (2023.01)

(52) U.S. Cl.
  CPC ......... H04N 13/207 (2018.05); H04N 13/218 (2018.05); H04N 25/581 (2023.01); H04N 25/705 (2023.01); H04N 25/745 (2023.01); H04N 25/75 (2023.01); H04N 25/40 (2023.01); H04N 25/616 (2023.01)

(56) References Cited

U.S. PATENT DOCUMENTS

| | | | |
|---|---|---|---|
| 10,841,504 B1* | 11/2020 | Talbert | H04N 25/133 |
| 2010/0020209 A1* | 1/2010 | Kim | H04N 25/00 348/E5.022 |
| 2012/0008030 A1* | 1/2012 | Kono | H04N 5/32 348/301 |
| 2013/0306841 A1* | 11/2013 | Tate | H04N 25/766 250/208.1 |
| 2014/0354865 A1 | 12/2014 | Yun | |
| 2015/0281613 A1* | 10/2015 | Vogelsang | H04N 25/772 348/300 |
| 2016/0307326 A1* | 10/2016 | Wang | G03B 15/02 |
| 2017/0350756 A1* | 12/2017 | Panicacci | G01J 1/4228 |
| 2018/0213205 A1* | 7/2018 | Oh | H01L 27/14627 |
| 2019/0174084 A1* | 6/2019 | Kuo | H04N 25/772 |
| 2020/0404201 A1* | 12/2020 | Talbert | G06T 7/0014 |
| 2022/0116565 A1* | 4/2022 | Tsai | H04N 25/59 |
| 2022/0123033 A1* | 4/2022 | Park | H01L 27/14605 |
| 2022/0232185 A1* | 7/2022 | Song | H04N 13/204 |

FOREIGN PATENT DOCUMENTS

| | | | |
|---|---|---|---|
| CN | 111193881 A | 5/2020 | |
| WO | WO-2020056059 A1 * | 3/2020 | ......... G01D 5/35312 |
| WO | WO-2022002174 A1 * | 1/2022 | |

* cited by examiner

IMAGE SENSING DEVICE USING A SINGLE ANALOG TO DIGITAL CONVERSION OPERATION ON PIXEL SIGNALS AND OPERATING METHOD THEREOF

CROSS-REFERENCE TO RELATED APPLICATION(S)

This application claims priority under 35 U.S.C. § 119 to Korean Patent Application No. 10-2021-0047962, filed on Apr. 13, 2021, the disclosure of which is incorporated herein by reference in its entirety.

BACKGROUND

1. Field

Various embodiments of the present disclosure relate to a semiconductor design technique, and more particularly, to an image sensing device and an operating method thereof.

2. Description of the Related Art

Image sensing devices are devices for capturing images using the property of a semiconductor which reacts to light. Image sensing devices may be roughly classified into charge-coupled device (CCD) image sensing devices and complementary metal-oxide semiconductor (CMOS) image sensing devices. Recently, CMOS image sensing devices are widely used because the CMOS image sensing devices can allow both analog and digital control circuits to be directly implemented on a single integrated circuit (IC).

SUMMARY

Various embodiments of the present disclosure are directed to an image sensing device that may convert a plurality of pixel signals through a single analog to digital (A/D) conversion operation, and an operating method of the image sensing device.

In accordance with one embodiment, an image sensing device may include: a first sampling circuit suitable for sampling a reference ramp signal as a ramp signal; a switching circuit suitable for sequentially outputting first and second pixel signals to a common node based on first and second control signals; a second sampling circuit suitable for sampling the first and second pixel signals, which are sequentially outputted through the common node, as a measurement signal; a comparison circuit suitable for comparing the ramp signal with the measurement signal and generating a comparison signal corresponding to a comparison result; and a count circuit suitable for generating a count signal, which corresponds to a voltage level of the measurement signal, based on the comparison signal and a clock signal.

The measurement signal may have a voltage level corresponding to a voltage level difference between the first pixel signal and the second pixel signal.

In accordance with another embodiment, an image sensing device may include: a first sampling circuit suitable for sampling a first reference ramp signal as a first ramp signal; a second sampling circuit suitable for sampling a second reference ramp signal as a second ramp signal; a first switching circuit suitable for outputting first and second pixel signals to a first common node according to a first order based on first and second control signals; a third sampling circuit suitable for sampling the first and second pixel signals, which are outputted through the first common node, as a first measurement signal; a second switching circuit suitable for outputting the first and second pixel signals to a second common node according to a second order, which is opposite to the first order, based on third and fourth control signals; a fourth sampling circuit suitable for sampling the first and second pixel signals, which are outputted through the second common node, as a second measurement signal; a comparison circuit suitable for simultaneously comparing the first and second ramp signals with the first and second measurement signals, and generating a comparison signal corresponding to a comparison result; and a count circuit suitable for generating a count signal, which corresponds to a voltage level of the first measurement signal and a voltage level of the second measurement signal, based on the comparison signal and a clock signal.

The first measurement signal may have a first voltage level obtained by subtracting a voltage level of the first pixel signal from a voltage level of the second pixel signal, and the second measurement signal may have a second voltage level obtained by subtracting the voltage level of the second pixel signal from the voltage level of the first pixel signal.

In accordance with another embodiment, an image sensing device may include: a pair of pixels suitable for generating first and second pixel signals; and a signal converter suitable for generating a depth information signal, which corresponds to a voltage level difference between the first and second pixel signals, through a single analog to digital conversion operation.

In accordance with another embodiment, an operating method of an image sensing device may include: sampling a reference ramp signal as a ramp signal; sequentially sampling, as a measurement signal, a pair of pixel signals indicating a depth from a subject; generating, based on the ramp signal and the measurement signal, a comparison signal corresponding to a voltage difference between the pair; and generating a depth information signal based on the comparison signal.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
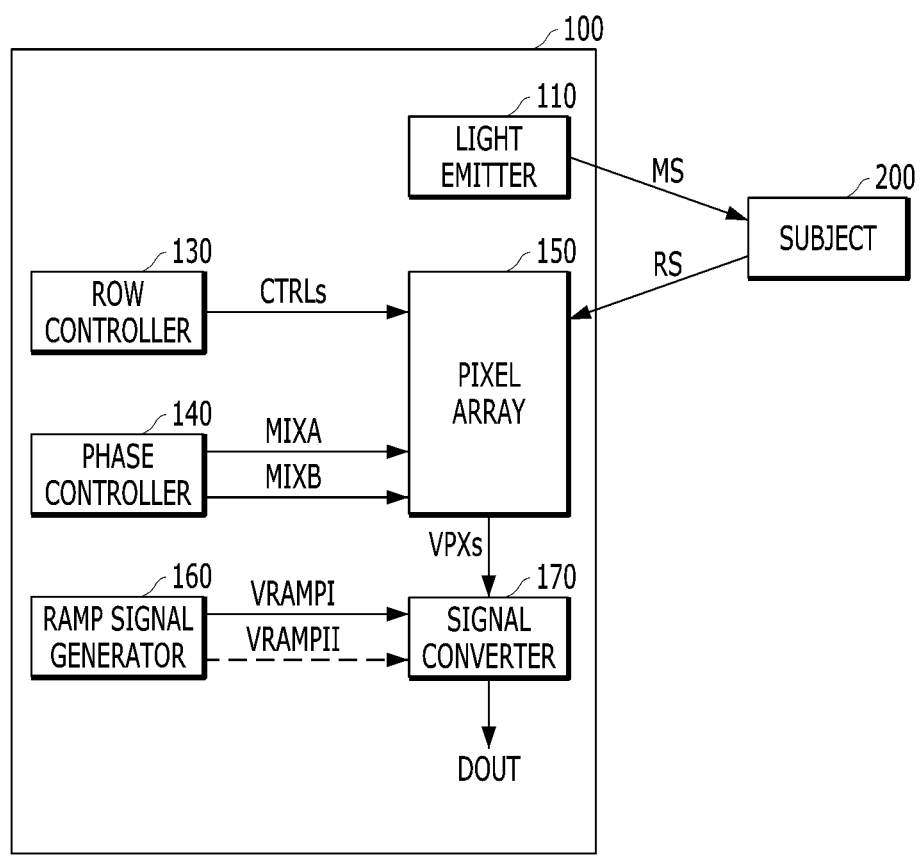
FIG. 1 is a block diagram illustrating an image sensing device in accordance with one embodiment.

FIG. 1 is a block diagram illustrating an image sensing device 100 in accordance with one embodiment.

Referring to FIG. 1, the image sensing device 100 may generate a depth information signal DOUT indicating a depth from a subject 200 using a time of flight (TOF) method. For example, the image sensing device 100 may generate the depth information signal DOUT by detecting a phase difference between a first light signal MS that is outputted to the subject 200 and a second light signal RS that is reflected from the subject 200.

The image sensing device 100 may include a light emitter 110, a row controller 130, a phase controller 140, a pixel array 150, a ramp signal generator 160 and a signal converter 170.

The light emitter 110 may output the first light signal MS to the subject 200. For example, the first light signal MS may be a periodic signal that periodically toggles. The first light signal MS may be reflected from the subject 200, and be received by the pixel array 150 as the second light signal RS.

The row controller 130 may generate a plurality of row control signals CTRLs for controlling the pixel array 150 for each row. For example, the row controller 130 may generate first row control signals for controlling pixels arranged in a first row of the pixel array 150, and generate $n^{th}$ row control signals for controlling pixels arranged in an $n^{th}$ row of the pixel array 150, where "n" is a natural number greater than 2.

The phase controller 140 may generate first and second control signals MIXA and MIXB having different phases. For example, the first and second control signals MIXA and MIXB may have a phase difference of 180 degrees. The first and second control signals MIXA and MIXB may have the same period as the first light signal MS, and any of the first and second control signals MIXA and MIXB may have the same phase as the first light signal MS.

The pixel array 150 may receive the second light signal RS, the plurality of row control signals CTRLs and the first and second control signals MIXA and MIXB, and generate a plurality of pixel signals VPXs. The pixel array 150 may receive background light together with the second light signal RS. The pixel array 150 may include at least one pair of pixels for measuring the depth from the subject 200. For example, the pair of pixels may be selected based on the plurality of row control signals CTRLs, and generate first and second pixel signals VPXA and VPXB based on the first and second control signals MIXA and MIXB and the second light signal RS. The first and second control signals MIXA and MIXB may be signals having a phase difference of 180 degrees. The pair of pixels is described in more detail with reference to FIG. 2.

The ramp signal generator 160 may generate at least one reference ramp signal. According to one example, the ramp signal generator 160 may generate a reference ramp signal VRAMPI. According to another example, the ramp signal generator 160 may generate first and second reference ramp signals VRAMPI and VRAMPII. The first and second reference ramp signals VRAMPI and VRAMPII may ramp in directions opposite to each other within the same ramping range.

The signal converter 170 may generate the depth information signal DOUT based on the at least one reference ramp signal and the plurality of pixel signals VPXs. For example, the signal converter 170 may generate the depth information signal DOUT corresponding to a voltage level difference between the first and second pixel signals VPXA and VPXB through a signal analog to digital (A/D) conversion operation.

Figure 2:
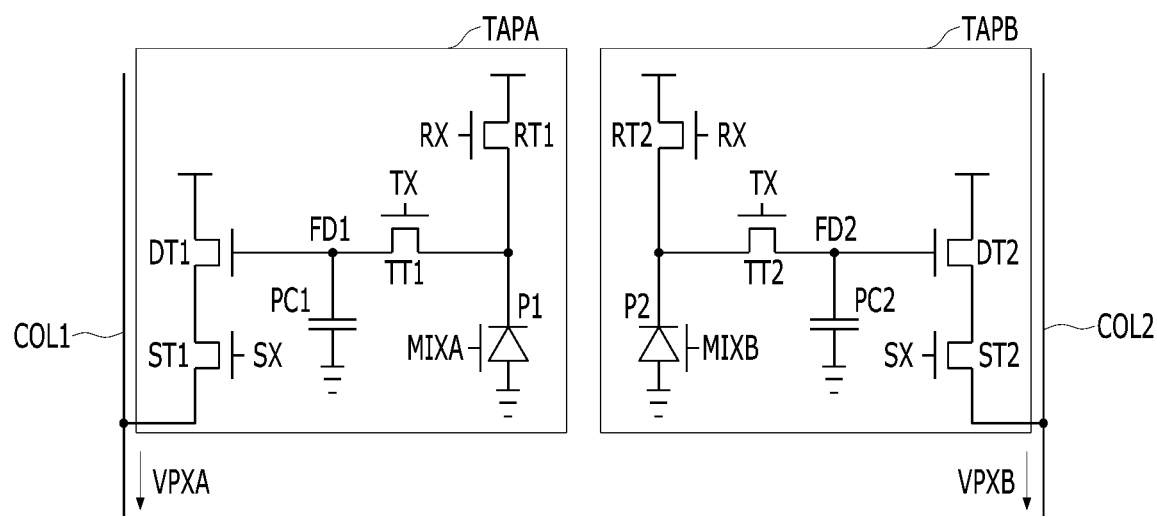
FIG. 2 is a circuit diagram illustrating a pair of pixels of a pixel array illustrated in FIG. 1.

FIG. 2 is a circuit diagram illustrating the pair of pixels referenced in the description of in FIG. 1.

Referring to FIG. 2, the pair of pixels may include a first pixel TAPA and a second pixel TAPB. The pair of pixels receiving control signals MIXA and MIXB are suitable for generating first and second pixel signals indicating a depth from a subject.

The first pixel TAPA may generate the first pixel signal VPXA based on a reset signal RX, a transmission signal TX, a selection signal SX and the first control signal MIXA. The reset signal RX, the transmission signal TX and the selection signal SX may be signals included in the plurality of row control signals CTRLs described above. For example, the first pixel TAPA may include a first sensing circuit P1, a first transmission circuit TT1, a first charge storage circuit PC1, a first reset circuit RT1, a first driving circuit DT1 and a first selection circuit ST1.

The first sensing circuit P1 may be coupled between the first transmission circuit TT1 and a low voltage terminal. The first sensing circuit P1 may generate first charges, which correspond to the second light signal RS and the background light, based on the first control signal MIXA. For example, the first sensing circuit P1 may include a photodiode.

The first transmission circuit TT1 may be coupled between a first floating diffusion node FD1 and the first sensing circuit P1. The first transmission circuit TT1 may couple the first reset circuit RT1 to the first charge storage circuit PC1 when the first sensing circuit P1 is reset, or transmit the first charges, which are generated by the first sensing circuit P1, to the first charge storage circuit PC1, based on the transmission signal TX. For example, the first transmission circuit TT1 may include an NMOS transistor.

The first charge storage circuit PC1 may be coupled between the first floating diffusion node FD1 and the low voltage terminal. For example, the first charge storage circuit PC1 may be a parasitic capacitor.

The first reset circuit RT1 may be coupled between a first high voltage terminal and the first sensing circuit P1. The first reset circuit RT1 may reset the first sensing circuit P1 and the first charge storage circuit PC1 based on the reset signal RX. For example, the first reset circuit RT1 may include an NMOS transistor.

The first driving circuit DT1 may be coupled between a second high voltage terminal and the first selection circuit ST1. The second high voltage terminal may be the same as or different from the first high voltage terminal. The first driving circuit DT1 may drive a first column line COL1 with a high voltage, which is supplied through the second high voltage terminal, based on a voltage loaded on the first floating diffusion node FD1. For example, the first driving circuit DT1 may include an NMOS transistor.

The first selection circuit ST1 may be coupled between the first driving circuit DT1 and the first column line COL1. The first selection circuit ST1 may selectively couple the first driving circuit DT1 to the first column line COL1 based on the selection signal SX. For example, the first selection circuit ST1 may include an NMOS transistor.

The second pixel TAPB may generate the second pixel signal VPXB based on a reset signal RX, a transmission signal TX, a selection signal SX and the second control signal MIXB. For example, the second pixel TAPB may include a second sensing circuit P2, a second transmission circuit TT2, a second charge storage circuit PC2, a second reset circuit RT2, a second driving circuit DT2 and a second selection circuit ST2.

The second sensing circuit P2 may be coupled between the second transmission circuit TT2 and a low voltage terminal. The second sensing circuit P2 may generate second charges, which correspond to the second light signal RS and the background light, based on the second control signal MIXB. For example, the second sensing circuit P2 may include a photodiode.

The second transmission circuit TT2 may be coupled between a second floating diffusion node FD2 and the second sensing circuit P2. The second transmission circuit TT2 may couple the second reset circuit RT2 to the second charge storage circuit PC2 when the second sensing circuit P2 is reset or transmit the second charges, which are generated by the second sensing circuit P2, to the second charge storage circuit PC2, based on the transmission signal TX. For example, the second transmission circuit TT2 may include an NMOS transistor.

The second charge storage circuit PC2 may be coupled between the second floating diffusion node FD2 and the low voltage terminal. For example, the second charge storage circuit PC2 may be a parasitic capacitor.

The second reset circuit RT2 may be coupled between the first high voltage terminal and the second sensing circuit P2. The second reset circuit RT2 may reset the second sensing circuit P2 and the second charge storage circuit PC2 based on the reset signal RX. For example, the second reset circuit RT2 may include an NMOS transistor.

The second driving circuit DT2 may be coupled between the second high voltage terminal and the second selection circuit ST2. The second driving circuit DT2 may drive a second column line COL2 with the high voltage, which is supplied through the second high voltage terminal, based on a voltage loaded on the second floating diffusion node FD2. For example, the second driving circuit DT2 may include an NMOS transistor.

The second selection circuit ST2 may be coupled between the second driving circuit DT2 and the second column line COL2. The second selection circuit ST2 may selectively couple the second driving circuit DT2 to the second column line COL2 based on the selection signal SX. For example, the second selection circuit ST2 may include an NMOS transistor.

Figure 3:
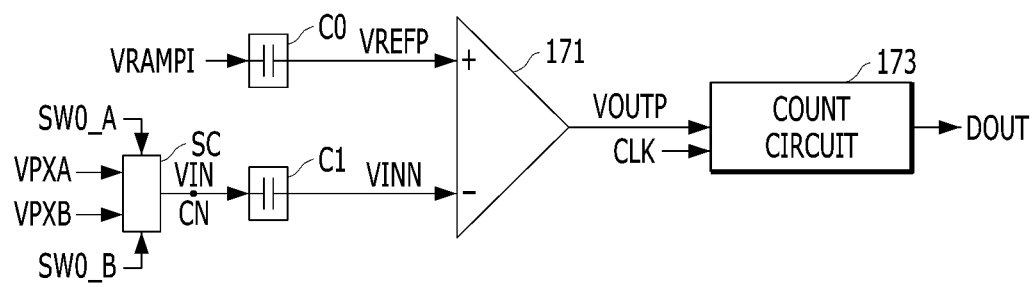
FIG. 3 is a block diagram illustrating an example of a signal converter illustrated in FIG. 1.

FIG. 3 is a block diagram illustrating an example of the signal converter 170 illustrated in FIG. 1. FIG. 3 illustrates only configurations corresponding to the pair of pixels.

Referring to FIG. 3, the signal converter 170 may include a first sampling circuit C0, a switching circuit SC, a second sampling circuit C1, a comparison circuit 171 and a count circuit 173.

The first sampling circuit C0 may sample the reference ramp signal VRAMPI and generate a ramp signal VREFP. For example, the first sampling circuit C0 may include a capacitor.

The switching circuit SC may sequentially output the first and second pixel signals VPXA and VPXB as a pixel signal VIN to a common node CN based on first and second control signals SW0_A and SW0_B.

The second sampling circuit C1 may sample the pixel signal VIN sequentially outputted through the common node CN, and output the sampled pixel signal as a measurement signal VINN. For example, the second sampling circuit C1 may include a capacitor.

The comparison circuit 171 may have a 2-input/2-output structure. For example, the comparison circuit 171 may have a non-inverting (+) input terminal receiving the ramp signal VREFP, an inverting (−) input terminal receiving the measurement signal VINN, and an output terminal outputting a comparison signal VOUTP. The present embodiment describes an example in which the comparison circuit 171 has first and second output terminals, but outputs the comparison signal VOUTP through the first output terminal among the first and second output terminals.

The comparison circuit 171 may compare the ramp signal VREFP with the measurement signal VINN, and output the comparison signal VOUTP corresponding to the comparison result. For example, the comparison circuit 171 may generate the comparison signal VOUTP, which corresponds to a voltage level difference between the first and second pixel signals VPXA and VPXB, through a single comparison operation.

The count circuit 173 may generate a count signal, which corresponds to a voltage level difference between the first and second pixel signals VPXA and VPXB, as the depth information signal DOUT based on the comparison signal VOUTP and a clock signal CLK.

Figure 4:
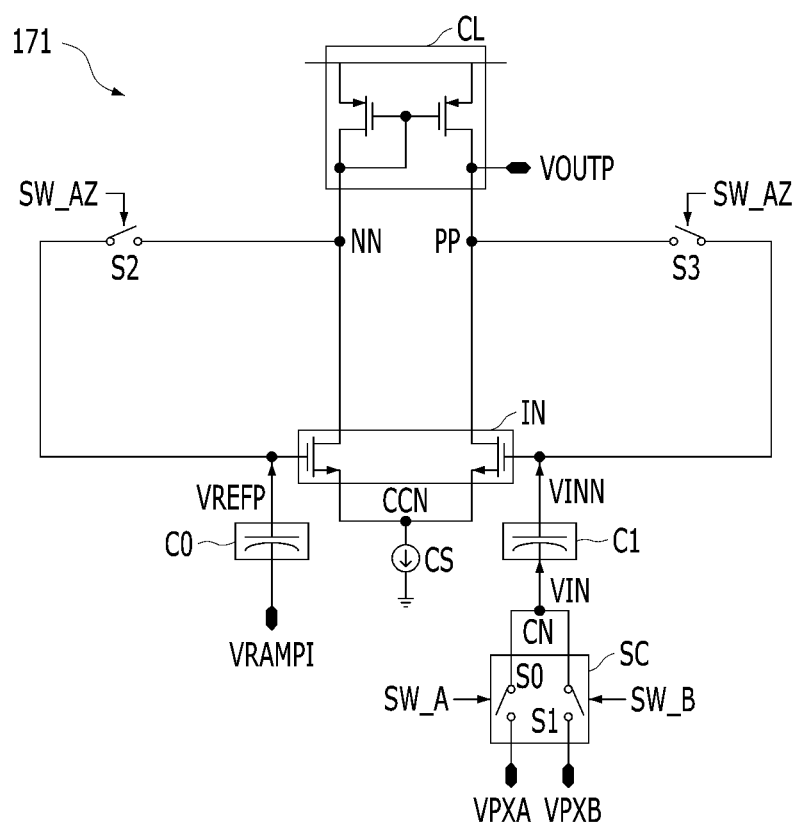
FIG. 4 is a circuit diagram illustrating a first sampling circuit, a second sampling circuit, a switching circuit and a comparison circuit illustrated in FIG. 3.

FIG. 4 is a circuit diagram illustrating the first sampling circuit C0, the switching circuit SC, the second sampling circuit C1 and the comparison circuit 171 illustrated in FIG. 3.

Referring to FIG. 4, the first sampling circuit C0 may output the ramp signal VREFP having the same waveform as the reference ramp signal VRAMPI to the non-inverting (+) input terminal of the comparison circuit 171 during a single rolling readout period CC.

The switching circuit SC may include first and second switching elements S0 and S1. The first switching element S0 may output one pixel signal (i.e., VPXA) of the first and second pixel signals VPXA and VPXB to the common node CN during a conversion period RR of the single rolling readout period CC, based on the first control signal SW_A. For example, the first switching element S0 may output the first pixel signal VPXA to the common node CN during the conversion period RR. The second switching element S1 may output the other pixel signal (i.e., VPXB) of the first and second pixel signals VPXA and VPXB to the common node CN during an auto-zeroing period ZZ of the single rolling readout period CC, based on the second control signal SW_B. For example, the second switching element S1 may output the second pixel signal VPXB to the common node CN during the auto-zeroing period ZZ.

The second sampling circuit C1 may generate the measurement signal VINN, which corresponds to the voltage level difference between the first and second pixel signals VPXA and VPXB, according to the first and second pixel signals VPXA and VPXB sequentially inputted during the single rolling readout period CC.

The comparison circuit 171 may include a current supply circuit CL, an input circuit IN, a sink circuit CS, a third switching element S2 and a fourth switching element S3.

The current supply circuit CL may be coupled between a high voltage terminal and a pair of output terminals NN and PP.

The input circuit IN may be coupled between the pair of output terminals NN and PP and a node CC. The input circuit IN may receive the measurement signal VINN and the ramp signal VREFP. For example, the input circuit IN may include a first input element and a second input element. The first input element may be coupled between a first output terminal PP among the pair of output terminals NN and PP and the node CC, and receive the measurement signal VINN. The second input element may be coupled between a second output terminal NN among the pair of output terminals NN and PP and the node CC, and receive the ramp signal VREFP.

The sink circuit CS may be coupled between the node CC and a low voltage terminal.

The third switching element S2 may be coupled between the non-inverting (+) input terminal and the second output terminal NN. The third switching element S2 may precharge the non-inverting (+) input terminal to a predetermined voltage level VAZ during the auto-zeroing period ZZ based on a third control signal SW_AZ. The predetermined voltage level VAZ may correspond to a gate-source voltage Vgs of a diode-connected PMOS transistor included in the current supply circuit CL.

The fourth switching element S3 may be coupled between the inverting (−) input terminal and the first output terminal PP. The fourth switching element S3 may precharge the inverting (−) input terminal to the predetermined voltage level VAZ during the auto-zeroing period ZZ based on the third control signal SW_AZ.

Figure 5:
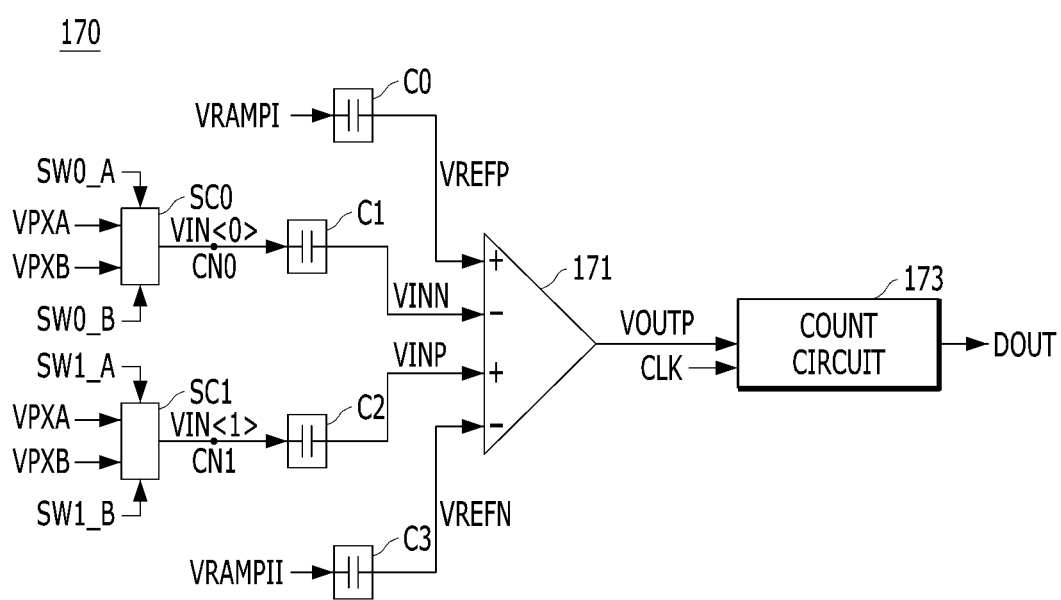
FIG. 5 is a block diagram illustrating another example of the signal converter illustrated in FIG. 1.

FIG. 5 is a block diagram illustrating another example of the signal converter 170 illustrated in FIG. 1.

Referring to FIG. 5, the signal converter 170 may include a first sampling circuit C0, a first switching circuit SC0, a second sampling circuit C1, a second switching circuit SC1, a third sampling circuit C2, a fourth sampling circuit C3, a comparison circuit 171 and a count circuit 173.

The first sampling circuit C0 may sample the first reference ramp signal VRAMPI, and generate the first ramp signal VREFP. For example, the first sampling circuit C0 may include a capacitor.

The first switching circuit SC0 may output the first and second pixel signals VPXA and VPXB to a first common node CN0 according to a first order based on first and second control signals SW0_A and SW0_B. For example, the first switching circuit SC0 may output the second pixel signal VPXB to the first common node CN0, and subsequently output the first pixel signal VPXA to the first common node CN0.

The second sampling circuit C1 may sample a pixel signal VIN<0> outputted according to the first order through the first common node CN0, and output the sampled pixel signal as a first measurement signal VINN. For example, the second sampling circuit C1 may include a capacitor.

The second switching circuit SC1 may output the first and second pixel signals VPXA and VPXB to a second common node CN1 according to a second order, which is opposite to the first order, based on third and fourth control signals SW1_A and SW1_B. For example, the second switching circuit SC1 may output the first pixel signal VPXA to the second common node CN1, and subsequently output the second pixel signal VPXB to the second common node CN1.

The third sampling circuit C2 may sample a pixel signal VIN<1> outputted according to the second order through the second common node CN1, and output the sampled pixel signal as a second measurement signal VINP. For example, the third sampling circuit C2 may include a capacitor.

The fourth sampling circuit C3 may sample the second reference ramp signal VRAMPII, and generate a second ramp signal VREFN. The second reference ramp signal VRAMPII may ramp in a direction opposite to the first reference ramp signal VRAMPI. For example, the fourth sampling circuit C3 may include a capacitor.

The comparison circuit 171 may have a 4-input/2-output structure. For example, the comparison circuit 171 may have a first non-inverting (+) input terminal receiving the first ramp signal VREFP, a first inverting (−) input terminal receiving the first measurement signal VINN, a second non-inverting (+) input terminal receiving the second measurement signal VINP, a second inverting (−) input terminal receiving the second ramp signal VREFN, and an output terminal outputting the comparison signal VOUTP. The present embodiment describes an example in which the comparison circuit 171 has first and second output terminals, but outputs the comparison signal VOUTP through the first output terminal among the first and second output terminals.

The comparison circuit 171 may simultaneously compare the first ramp signal VREFP with the first measurement signal VINN and the second ramp signal VREFN with the second measurement signal VINP, and output the comparison signal VOUTP corresponding to the comparison result. For example, the comparison circuit 171 may generate the comparison signal VOUTP, which corresponds to a voltage level difference between the first and second pixel signals VPXA and VPXB, through a single comparison operation.

The count circuit 173 may generate a count signal, which corresponds to a voltage level difference between the first and second pixel signals VPXA and VPXB, as the depth information signal DOUT based on the comparison signal VOUTP and the clock signal CLK.

Figure 6:
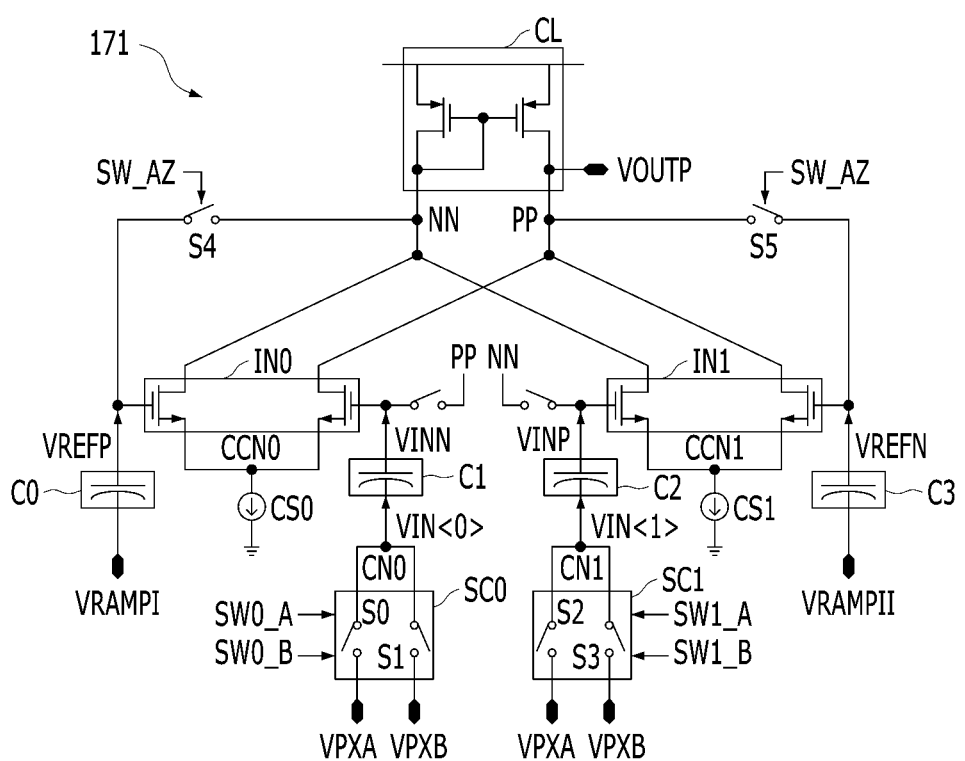
FIG. 6 is a circuit diagram illustrating a first sampling circuit, a second sampling circuit, a third sampling circuit, a fourth sampling circuit, a first switching circuit, a second switching circuit and a comparison circuit illustrated in FIG. 5.

FIG. 6 is a circuit diagram illustrating the first sampling circuit C0, the second sampling circuit C1, the third sampling circuit C2, the fourth sampling circuit C3, the first switching circuit SC0, the second switching circuit SC1 and the comparison circuit 171 illustrated in FIG. 5.

Referring to FIG. 6, the first sampling circuit C0 may output the first ramp signal VREFP having the same waveform as the first reference ramp signal VRAMPI to the first non-inverting (+) input terminal of the comparison circuit 171 during the single rolling readout period CC.

The first switching circuit SC0 may include first and second switching elements S0 and S1. The first switching element S0 may output any one of the first and second pixel signals VPXA and VPXB to the first common node CN0 during a conversion period RR of the single rolling readout period CC based on the first control signal SW0_A. For example, the first switching element S0 may output the first pixel signal VPXA to the first common node CN0 during the conversion period RR. The second switching element S1 may output the other one of the first and second pixel signals VPXA and VPXB to the first common node CN0 during the auto-zeroing period ZZ of the single rolling readout period CC based on the second control signal SW0_B. For example, the second switching element S1 may output the second pixel signal VPXB to the first common node CN0 during the auto-zeroing period ZZ.

The second sampling circuit C1 may output the first measurement signal VINN, which corresponds to the voltage level difference between the first and second pixel signals VPXA and VPXB, to the first inverting (−) input terminal of the comparison circuit 171 according to the first and second pixel signals VPXA and VPXB inputted in the first order during the single rolling readout period CC. That is, the second sampling circuit C1 may generate the first measurement signal VINN that has a voltage level obtained by subtracting a voltage level of the first pixel signal VPXA from a voltage level of the second pixel signal VPXB.

The second switching circuit SC1 may include third and fourth switching elements S2 and S3. The third switching element S2 may output any one of the first and second pixel signals VPXA and VPXB to the second common node CN1 during the auto-zeroing period ZZ of the single rolling readout period CC based on the third control signal SW1_A. The third control signal SW1_A may be the same signal as the second control signal SW0_B. For example, the third switching element S2 may output the first pixel signal VPXA to the second common node CN1 during the auto-zeroing period ZZ. The fourth switching element S3 may output the other one of the first and second pixel signals VPXA and VPXB to the second common node CN1 during the conversion period RR of the single rolling readout period CC based on the fourth control signal SW1_B. The fourth control signal SW1_B may be the same signal as the first control signal SW0_A. For example, the fourth switching element S3 may output the second pixel signal VPXB to the second common node CN1 during the conversion period RR.

The third sampling circuit C2 may output the second measurement signal VINP, which corresponds to a voltage level difference between the first and second pixel signals VPXA and VPXB, to the second non-inverting (+) input terminal of the comparison circuit 171 according to the first and second pixel signals VPXA and VPXB inputted in the second order during the single rolling readout period CC. That is, the third sampling circuit C2 may generate the second measurement signal VINP that has a voltage level obtained by subtracting a voltage level of the second pixel signal VPXB from a voltage level of the first pixel signal VPXA.

The fourth sampling circuit C3 may output the second ramp signal VREFN having the same waveform as the second reference ramp signal VRAMPII to the second inverting (−) input terminal of the comparison circuit 171 during the single rolling readout period CC.

The comparison circuit 171 may include a current supply circuit CL, a first input circuit IN0, a first sink circuit CS0, a fifth switching element S4, a second input circuit IN1, a second sink circuit CS1 and a sixth switching element S5.

The current supply circuit CL may be coupled between a high voltage terminal and a pair of output terminals NN and PP.

The first input circuit IN0 may be coupled between the pair of output terminals NN and PP and a first node. The first input circuit IN0 may receive the first measurement signal VINN and the first ramp signal VREFP. For example, the first input circuit IN0 may include a first input element and a second input element. The first input element may be coupled between a first output terminal PP among the pair of output terminals NN and PP and the first node, and receive the first measurement signal VINN. The second input element may be coupled between a second output terminal NN among the pair of output terminals NN and PP and the first node, and receive the first ramp signal VREFP.

The first sink circuit CS0 may be coupled between the first node and a low voltage terminal.

The fifth switching element S4 may be coupled between the first non-inverting (+) input terminal and the second output terminal NN. The fifth switching element S4 may precharge the first non-inverting (+) input terminal to a predetermined voltage level VAZ during the auto-zeroing period ZZ based on a fifth control signal SW_AZ. The predetermined voltage level VAZ may correspond to a gate-source voltage Vgs of a diode-connected PMOS transistor included in the current supply circuit CL.

The second input circuit IN1 may be coupled between the pair of output terminals NN and PP and a second node. The second input circuit IN1 may receive the second measurement signal VINP and the second ramp signal VREFN. For example, the second input circuit IN1 may include a third input element and a fourth input element. The third input element may be coupled between the first output terminal PP among the pair of output terminals NN and PP and the second node, and receive the second ramp signal VREFN. The fourth input element may be coupled between the second output terminal NN among the pair of output terminals NN and PP and the second node, and receive the second measurement signal VINP.

The second sink circuit CS1 may be coupled between the second node and the low voltage terminal.

The sixth switching element S5 may be coupled between the second inverting (−) input terminal and the first output terminal PP. The sixth switching element S5 may precharge the second inverting (−) input terminal to the predetermined voltage level VAZ during the auto-zeroing period ZZ based on the fifth control signal SW_AZ.

Hereinafter, an operation of the image sensing device 100 according to the present embodiment, which has the above-described configuration, is described with reference to FIGS. 7 to 12.

Figure 7:
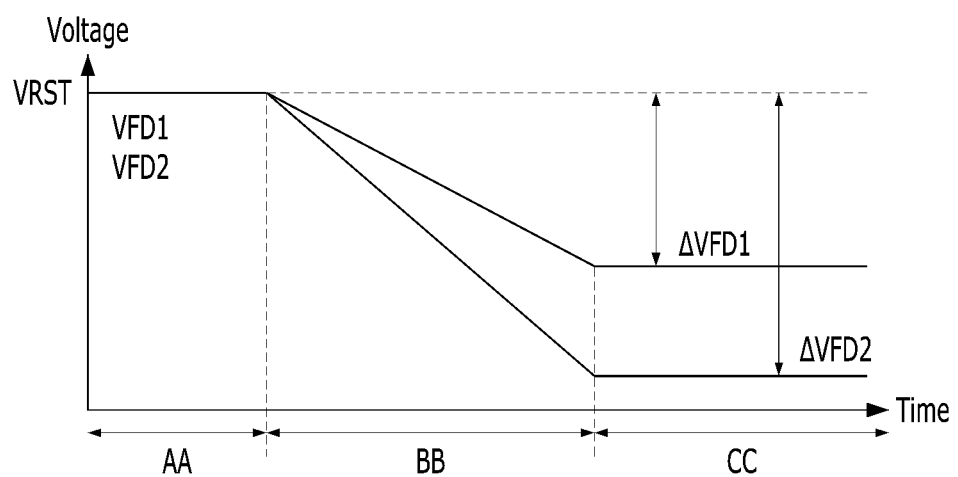
FIGS. 7 to 12 are timing diagrams illustrating an operation of the image sensing device illustrated in FIG. 1.
Figure 8:
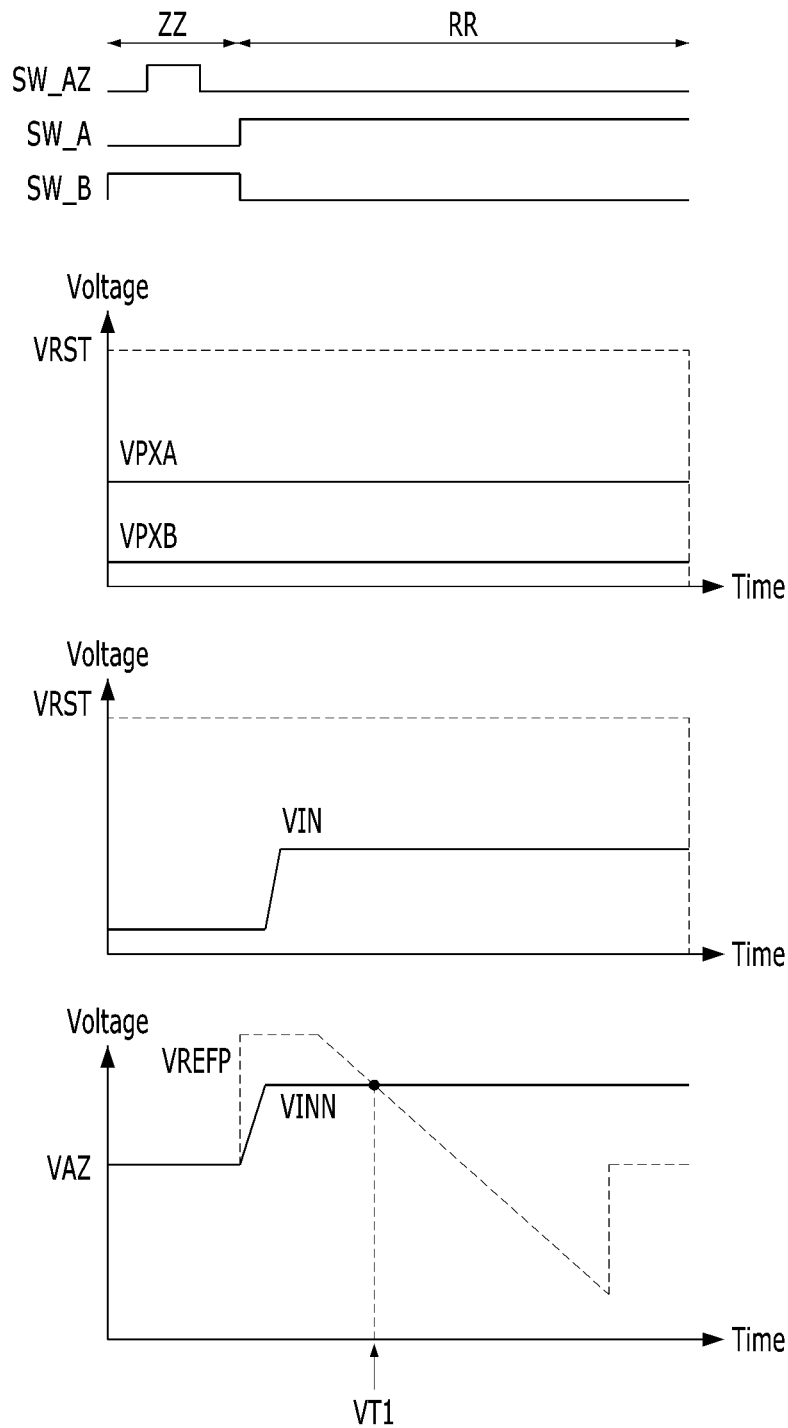
Figure 9:
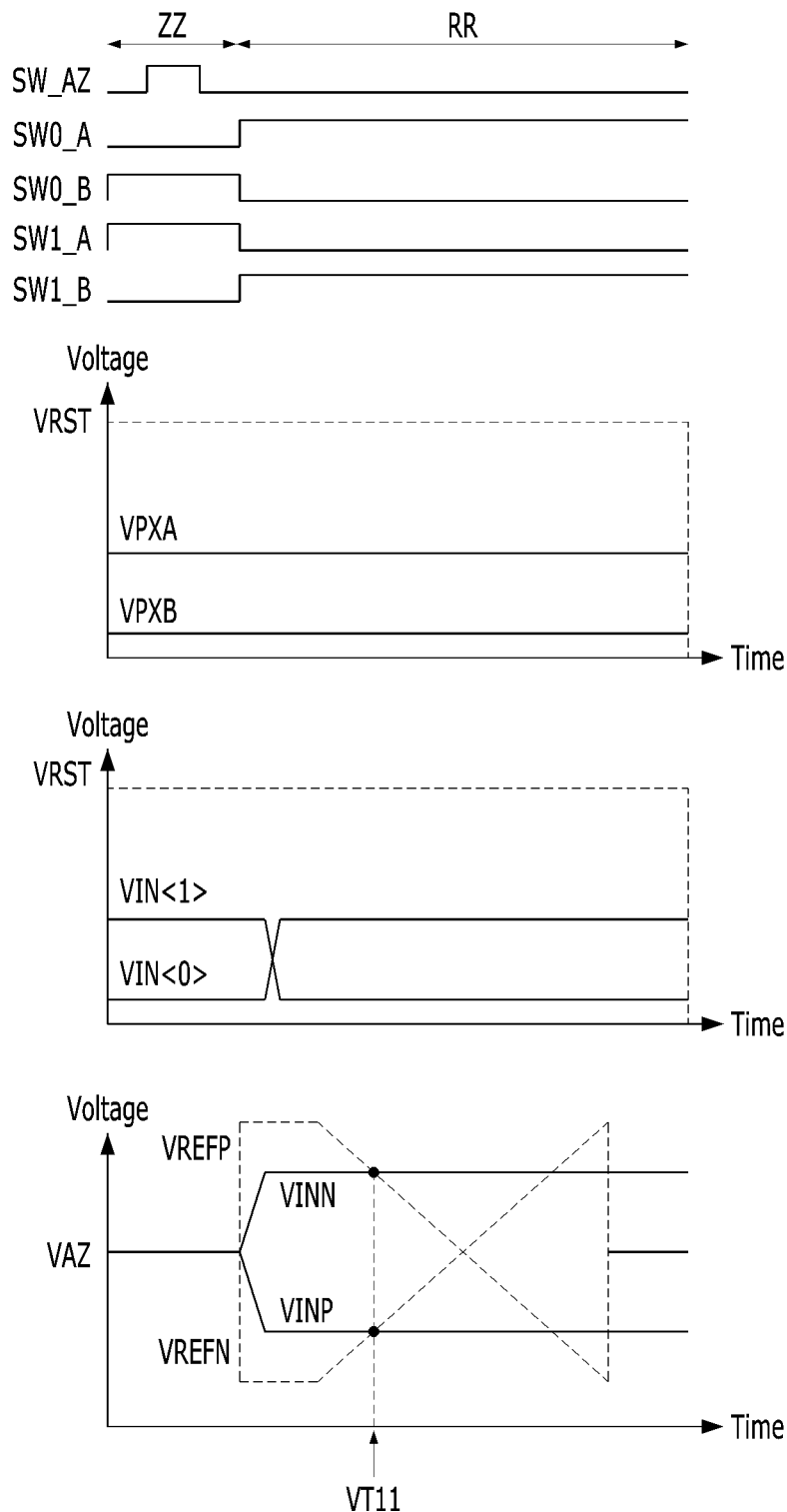

First, the operation of the image sensing device 100 is described according to an example with reference to FIGS. 7 to 9.

FIG. 7 is a timing diagram illustrating a case where a voltage loaded on the first floating diffusion node FD1 (hereinafter referred to as a "first voltage VFD1") is higher than a voltage loaded on the second floating diffusion node FD2 (hereinafter referred to as a "second voltage VFD2").

Referring to FIG. 7, the first voltage VFD1 and the second voltage VFD2 may have a reset level VRST during a reset period AA. The reset level VRST may correspond to a high voltage supplied through the first high voltage terminal. The voltage level of the first voltage VFD1 may change to a first target level during an integration time BB, and the voltage level of the second voltage VFD2 may change to a second target level during the integration time BB. The first voltage VFD1 and the second voltage VFD2 may be read out as the first pixel signal VPXA and the second pixel signal VPXB, respectively, during the single rolling readout period CC. In this case, a change amount ΔVFD1 of the voltage level of the first voltage VFD1 may be smaller than a change amount ΔVFD2 of the voltage level of the second voltage VFD2.

FIG. 8 is a timing diagram illustrating an example of the operation of the image sensing device 100 according to the single rolling readout section CC illustrated in FIG. 7. It may be seen that FIG. 8 is a timing diagram illustrating the operation of the image sensing device 100 including the circuits illustrated in FIGS. 3 and 4.

Referring to FIG. 8, during the auto-zeroing period ZZ, the switching circuit SC may output the second pixel signal VPXB to the common node CN based on the second control signal SW_B. During the conversion period RR, the switching circuit SC may output the first pixel signal VPXA to the common node CN based on the first control signal SW_A. The pixel signal VIN generated through the common node CN may have a voltage level, corresponding to the second pixel signal VPXB, during the auto-zeroing period ZZ, and have a voltage level, corresponding to the first pixel signal VPXA, during the conversion period RR. The measurement signal VINN may have a voltage level, corresponding to the predetermined voltage VAZ, during the auto-zeroing period ZZ and have a voltage level, that is, VAZ+(VPXA−VPXB), to which the predetermined voltage VAZ, the voltage level of the second pixel signal VPXB and the voltage level of the first pixel signal VPXA are applied, during the conversion period RR.

The comparison circuit 171 may compare the ramp signal VREFP with the measurement signal VINN during the conversion period RR, and allow the comparison signal VOUTP to transition at a time VT1 where the ramp signal VREFP and the measurement signal VINN have the same voltage level, as the comparison result.

The count circuit 173 may generate the count signal, which corresponds to a voltage level difference between the first pixel signal VPXA and the second pixel signal VPXB, as the depth information signal DOUT based on the comparison signal VOUTP and the clock signal CLK.

FIG. 9 is a timing diagram illustrating another example of the operation of the image sensing device 100 according to the single rolling readout section CC illustrated in FIG. 7. It may be seen that FIG. 9 is a timing diagram illustrating the operation of the image sensing device 100 including the circuits illustrated in FIGS. 5 and 6.

Referring to FIG. 9, during the auto-zeroing period ZZ, the first switching circuit SC0 may output the second pixel signal VPXB to the first common node CN0 based on the second control signal SW0_B. During the conversion period RR, the first switching circuit SC0 may output the first pixel signal VPXA to the first common node CN0 based on the first control signal SW0_A. The pixel signal VIN<0> generated through the first common node CN0 may have a voltage level, corresponding to the second pixel signal VPXB, during the auto-zeroing period ZZ, and have a voltage level, corresponding to the first pixel signal VPXA, during the conversion period RR. The first measurement signal VINN may have a voltage level, corresponding to the predetermined voltage VAZ, during the auto-zeroing period ZZ, and have a voltage level, that is, VAZ+(VPXA−VPXB), to which the predetermined voltage VAZ, the voltage level of the second pixel signal VPXB and the voltage level of the first pixel signal VPXA are applied, during the conversion period RR.

During the auto-zeroing period ZZ, the second switching circuit SC1 may output the first pixel signal VPXA to the second common node CN1 based on the third control signal SW1_A. During the conversion period RR, the second switching circuit SC1 may output the second pixel signal VPXB to the second common node CN1 based on the fourth control signal SW1_B. The pixel signal VIN<1> generated through the second common node CN1 may have a voltage level, corresponding to the first pixel signal VPXA, during the auto-zeroing period ZZ, and have a voltage level, corresponding to the second pixel signal VPXB, during the conversion period RR. The second measurement signal VINP may have a voltage level, corresponding to the predetermined voltage VAZ, during the auto-zeroing period ZZ, and have a voltage level, that is, VAZ+(VPXB−VPXA), to which the predetermined voltage VAZ, the voltage level of the first pixel signal VPXA and the voltage level of the second pixel signal VPXB are applied, during the conversion period RR.

The comparison circuit 171 may generate the comparison signal VOUTP based on the first and second ramp signals VREFP and VREFN and the first and second measurement signals VINN and VINP during the conversion period RR. The comparison signal VOUTP may transition at a time VT11 where the first and second ramp signals VREFP and VREFN and the first and second measurement signals VINN and VINP have the same voltage level. For example, the comparison circuit 171 may compare a double ramp signal, that is, VREFP−VREFN, with a double measurement signal, that is, 2×(VPXA−VPXB) and generate the comparison signal VOUTP corresponding to the comparison result. As the comparison signal VOUTP is generated using the double measurement signal, that is, 2×(VPXA−VPXB), a signal to noise ratio (SNR) of the comparison signal VOUTP may be improved compared to the comparison signal VOUTP illustrated in FIGS. 3 and 4.

The count circuit 173 may generate the count signal, which corresponds to a voltage level difference between the first pixel signal VPXA and the second pixel signal VPXB, as the depth information signal DOUT based on the comparison signal VOUTP and the clock signal CLK.

Figure 10:
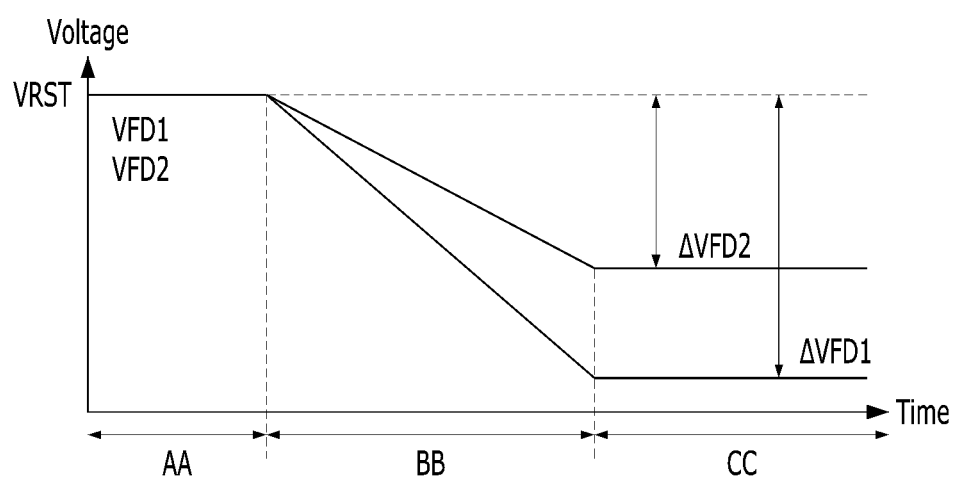
Figure 11:
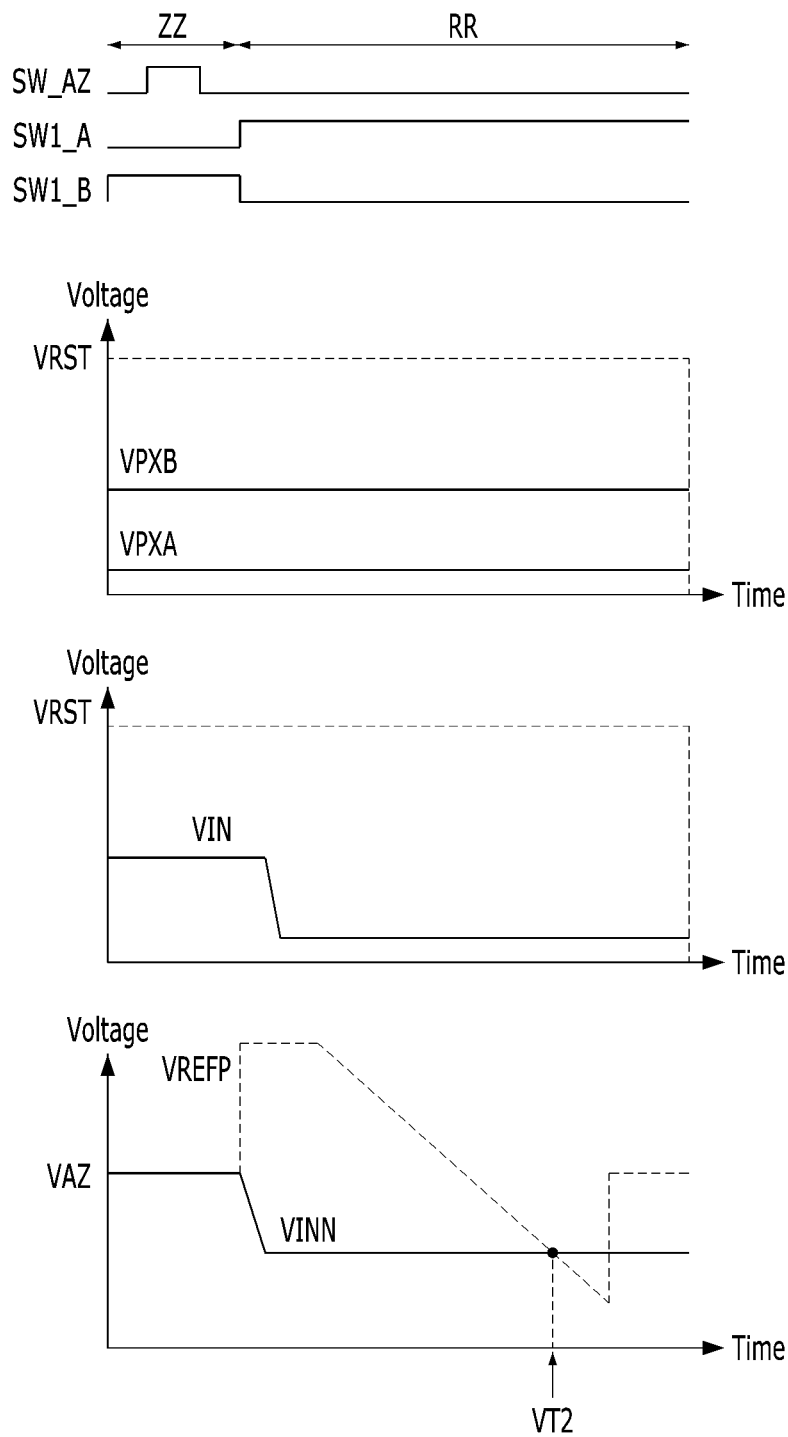
Figure 12:
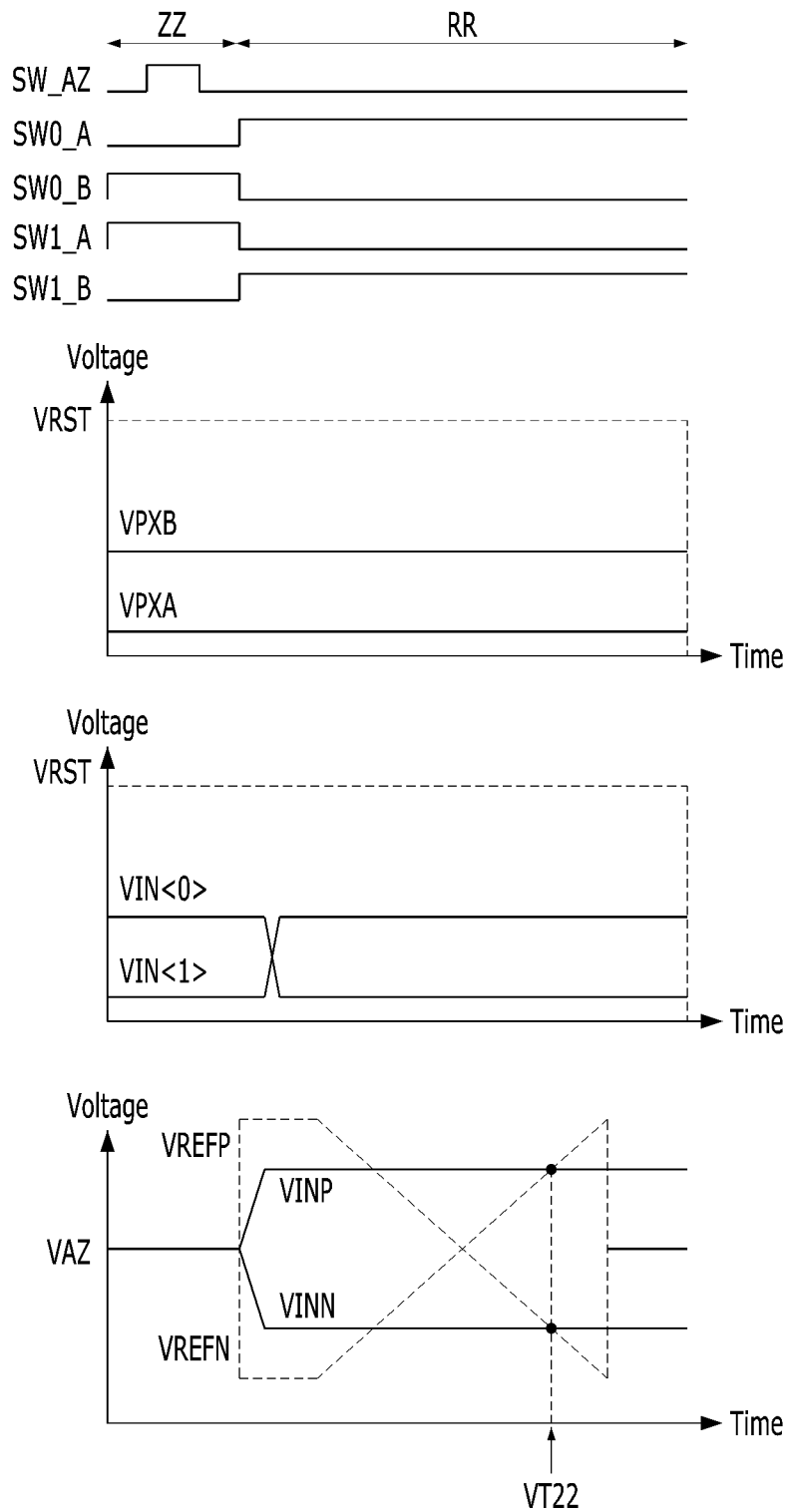

Next, the operation of the image sensing device 100 is described according to another example with reference to FIGS. 10 to 12.

FIG. 10 is a timing diagram illustrating a case where a voltage level of the first voltage VFD1 is lower than a voltage level of the second voltage VFD2.

Referring to FIG. 10, the first voltage VFD1 and the second voltage VFD2 may have a reset level VRST during a reset period AA. The voltage level of the first voltage VFD1 may change to a third target level during an integration time BB, and the voltage level of the second voltage VFD2 may change to a fourth target level during the integration time BB. The first voltage VFD1 and the second voltage VFD2 may be read out as the first pixel signal VPXA and the second pixel signal VPXB, respectively, during the single rolling readout period CC. In this case, a change amount ΔVFD1 of the voltage level of the first voltage VFD1 may be larger than a change amount ΔVFD2 of the voltage level of the second voltage VFD2.

FIG. 11 is a timing diagram illustrating an example of the operation of the image sensing device 100 according to the single rolling readout section CC illustrated in FIG. 10. It may be seen that FIG. 11 is a timing diagram illustrating the operation of the image sensing device 100 including the circuits illustrated in FIGS. 3 and 4.

Referring to FIG. 11, during the auto-zeroing period ZZ, the switching circuit SC may output the second pixel signal VPXB to the common node CN based on the second control signal SW_B. During the conversion period RR, the switching circuit SC may output the first pixel signal VPXA to the common node CN based on the first control signal SW_A. The pixel signal VIN generated through the common node CN may have a voltage level, corresponding to the second pixel signal VPXB, during the auto-zeroing period ZZ, and have a voltage level, corresponding to the first pixel signal VPXA, during the conversion period RR. Accordingly, by the second sampling circuit C1, the measurement signal VINN may have a voltage level, for example, VAZ−VPXB, to which the predetermined voltage VAZ and the voltage level of the second pixel signal VPXB are applied, during the auto-zeroing period ZZ, and have a voltage level, for example, VAZ−VPXB+VPXA, to which the predetermined voltage VAZ, the voltage level of the second pixel signal VPXB and the voltage level of the first pixel signal VPXA are applied, during the conversion period RR.

The comparison circuit 171 may compare the ramp signal VREFP with the measurement signal VINN during the conversion period RR, and allow the comparison signal VOUTP to transition at a time VT2 where the ramp signal VREFP and the measurement signal VINN have the same voltage level, as the comparison result.

The count circuit 173 may generate the count signal, which corresponds to a voltage level difference between the first pixel signal VPXA and the second pixel signal VPXB, as the depth information signal DOUT based on the comparison signal VOUTP and the clock signal CLK.

FIG. 12 is a timing diagram illustrating another example of the operation of the image sensing device 100 according to the single rolling readout section CC illustrated in FIG. 10. It may be seen that FIG. 12 is a timing diagram illustrating the operation of the image sensing device 100 including the circuits illustrated in FIGS. 5 and 6.

Referring to FIG. 12, during the auto-zeroing period ZZ, the first switching circuit SC0 may output the second pixel signal VPXB to the first common node CN0 based on the second control signal SW0_B. During the conversion period RR, the first switching circuit SC0 may output the first pixel signal VPXA to the first common node CN0 based on the first control signal SW0_A. The pixel signal VIN<0> generated through the first common node CN0 may have a voltage level, corresponding to the second pixel signal VPXB, during the auto-zeroing period ZZ, and have a voltage level, corresponding to the first pixel signal VPXA, during the conversion period RR. Accordingly, by the second sampling circuit C1, the first measurement signal VINN may have a voltage level, for example, VAZ−VPXB, to which the predetermined voltage VAZ and the voltage level of the second pixel signal VPXB are applied, during the auto-zeroing period ZZ, and have a voltage level, for example, VAZ−VPXB+VPXA, to which the predetermined voltage VAZ, the voltage level of the second pixel signal VPXB and the voltage level of the first pixel signal VPXA are applied, during the conversion period RR.

During the auto-zeroing period ZZ, the second switching circuit SC1 may output the first pixel signal VPXA to the second common node CN1 based on the third control signal SW1_A. During the conversion period RR, the second switching circuit SC1 may output the second pixel signal VPXB to the second common node CN1 based on the fourth control signal SW1_B. The pixel signal VIN<1> generated through the second common node CN1 may have a voltage level, corresponding to the first pixel signal VPXA, during the auto-zeroing period ZZ, and have a voltage level, corresponding to the second pixel signal VPXB, during the conversion period RR. Accordingly, by the third sampling circuit C2, the second measurement signal VINP may have a voltage level, for example, VAZ−VPXA, to which the predetermined voltage VAZ and the voltage level of the first pixel signal VPXA are applied, during the auto-zeroing period ZZ, and have a voltage level, for example, VAZ−VPXA+VPXB, to which the predetermined voltage VAZ, the voltage level of the first pixel signal VPXA and the voltage level of the second pixel signal VPXB are applied, during the conversion period RR.

The comparison circuit 171 may compare the first and second ramp signals VREFP and VREFN with the first and second measurement signals VINN and VINP, respectively, during the conversion period RR, and allow the comparison signal VOUTP to transition at a time VT22 where the first and second ramp signals VREFP and VREFN and the first and second measurement signals VINN and VINP have the same voltage level, as the comparison result.

The count circuit 173 may generate the count signal, which corresponds to a voltage level difference between the first pixel signal VPXA and the second pixel signal VPXB, as the depth information signal DOUT based on the comparison signal VOUTP and the clock signal CLK.

According to one embodiment of the present disclosure, a single analog to digital (A/D) conversion operation may be performed on first and second pixel signals, and a depth information signal corresponding to a voltage level difference between the first and second pixel signals may be obtained as a result of the single A/D conversion operation. In addition, as the voltage level difference between the first and second pixel signals is used during the single A/D conversion operation, background light reflected in each of the first and second pixel signals may be offset.

According to one embodiment of the present disclosure, a plurality of pixel signals are converted through a single analog to digital (A/D) conversion operation, thereby reducing an occupying area of a circuit related to the A/D conversion operation, that is, a signal converter, and reducing time and power consumption during the A/D conversion operation.

While the present disclosure has been illustrated and described with respect to specific embodiment, the disclosed embodiment is provided for the description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. An image sensing device comprising:
   a pair of pixels suitable for generating first and second pixel signals; and
   a signal converter suitable for generating a depth information signal, which corresponds to a voltage level difference between the first and second pixel signals, through a single analog to digital conversion operation, wherein the single analog to digital conversion operation compares at least one reference ramp signal with a signal which corresponds to the voltage level difference between the first and second pixel signals.

2. The image sensing device of claim 1, wherein the signal converter comprises:
   a first sampling circuit suitable for sampling a reference ramp signal as a ramp signal;
   a switching circuit suitable for sequentially outputting the first and second pixel signals to a common node based on first and second control signals;
   a second sampling circuit suitable for sampling the first and second pixel signals, which are sequentially outputted through the common node, as a measurement signal;
   a comparison circuit suitable for comparing the ramp signal with the measurement signal and generating a comparison signal corresponding to a comparison result; and
   a count circuit suitable for generating a count signal, which corresponds to a voltage level of the measurement signal, as the depth information signal based on the comparison signal and a clock signal.

3. The image sensing device of claim 2, wherein the measurement signal has a voltage level corresponding to the voltage level difference between the first and second pixel signals.

4. The image sensing device of claim 2, wherein the switching circuit comprises:
a first switching element suitable for outputting any one of the first and second pixel signals to the common node during an auto-zeroing period of a single rolling readout period, based on the first control signal; and
a second switching element suitable for outputting the other one of the first and second pixel signals to the common node during a conversion period of the single rolling readout period, based on the second control signal.

5. The image sensing device of claim 2, wherein the comparison circuit comprises:
a non-inverting input terminal suitable for receiving the ramp signal;
an inverting input terminal suitable for receiving the measurement signal; and
an output terminal suitable for outputting the comparison signal.

6. The image sensing device of claim 1, wherein the signal converter comprises:
a first sampling circuit suitable for sampling a first reference ramp signal as a first ramp signal;
a second sampling circuit suitable for sampling a second reference ramp signal as a second ramp signal;
a first switching circuit suitable for outputting the first and second pixel signals to a first common node according to a first order based on first and second control signals;
a third sampling circuit suitable for sampling the first and second pixel signals, which are outputted through the first common node, as a first measurement signal;
a second switching circuit suitable for outputting the first and second pixel signals to a second common node according to a second order, which is opposite to the first order, based on third and fourth control signals;
a fourth sampling circuit suitable for sampling the first and second pixel signals, which are outputted through the second common node, as a second measurement signal;
a comparison circuit suitable for simultaneously comparing the first and second ramp signals with the first and second measurement signals and generating a comparison signal corresponding to the comparison result; and
a count circuit suitable for generating, as the depth information signal, a count signal corresponding to a voltage level of the first measurement signal and a voltage level of the second measurement signal based on the comparison signal and a clock signal.

7. The image sensing device of claim 6,
wherein the first measurement signal has a first voltage level obtained by subtracting a voltage level of the first pixel signal from a voltage level of the second pixel signal, and wherein the second measurement signal has a second voltage level obtained by subtracting the voltage level of the second pixel signal from the voltage level of the first pixel signal.

8. The image sensing device of claim 6,
wherein the first switching circuit comprises:
a first switching element suitable for outputting any one of the first and second pixel signals to the first common node during an auto-zeroing period of a single rolling readout period, based on the first control signal; and
a second switching element suitable for outputting the other one of the first and second pixel signals to the first common node during a conversion period of the single rolling readout period, based on the second control signal, and
wherein the second switching circuit comprises:
a third switching element suitable for outputting the other one of the first and second pixel signals to the second common node during the auto-zeroing period of the single rolling readout period, based on the third control signal; and
a fourth switching element suitable for outputting the any one of the first and second pixel signals to the second common node during the conversion period of the single rolling readout period, based on the fourth control signal.

9. The image sensing device of claim 6, wherein the comparison circuit comprises:
a first non-inverting input terminal suitable for receiving the first ramp signal;
a first inverting input terminal suitable for receiving the first measurement signal;
a second non-inverting input terminal suitable for receiving the second measurement signal;
a second inverting input terminal suitable for receiving the second ramp signal; and
an output terminal suitable for outputting the comparison signal.

10. The image sensing device of claim 6, wherein the first and second ramp signals ramp in opposite directions within the same ramping range.

11. The image sensing device of claim 1, wherein the single analog to digital conversion operation includes a single comparison operation.

12. An operating method of an image sensing device, the operating method comprising:
sampling a reference ramp signal as a ramp signal;
sequentially sampling, as a measurement signal, a pair of pixel signals indicating a depth from a subject;
generating, based on the ramp signal and the measurement signal, a comparison signal corresponding to a voltage difference between the pair; and
generating a depth information signal based on the comparison signal.

* * * * *